(12) United States Patent
Corisis

(10) Patent No.: US 8,587,109 B2
(45) Date of Patent: Nov. 19, 2013

(54) STACKED MICROELECTRONIC DIES AND METHODS FOR STACKING MICROELECTRONIC DIES

(75) Inventor: David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/305,564

(22) Filed: Nov. 28, 2011

(65) Prior Publication Data

US 2012/0135569 A1    May 31, 2012

Related U.S. Application Data

(60) Continuation of application No. 11/751,402, filed on May 21, 2007, now Pat. No. 8,067,827, which is a division of application No. 10/620,714, filed on Jul. 15, 2003, now Pat. No. 7,235,871, which is a division of application No. 09/644,766, filed on Aug. 23, 2000, now Pat. No. 6,607,937.

(51) Int. Cl.
*H01L 23/02* (2006.01)
*H01L 23/34* (2006.01)

(52) U.S. Cl.
USPC ............ 257/686; 257/723; 257/730; 438/109

(58) Field of Classification Search
USPC ........... 257/738, 787, 686, 723, 730; 438/109
See application file for complete search history.

(56) References Cited

U.S. PATENT DOCUMENTS

| | | |
|---|---|---|
| 4,658,327 A | 4/1987 | Hernandez |
| 5,128,831 A | 7/1992 | Fox, III et al. |
| 5,138,438 A | 8/1992 | Masayuki et al. |
| 5,222,014 A | 6/1993 | Lin |
| 5,252,857 A | 10/1993 | Kane et al. |
| 5,323,060 A | 6/1994 | Fogal et al. |
| 5,386,343 A | 1/1995 | Pao |
| 5,509,599 A | 4/1996 | Laue et al. |
| 5,594,275 A | 1/1997 | Kwon et al. |
| 5,646,831 A | 7/1997 | Manteghi |
| 5,776,797 A | 7/1998 | Nicewarner, Jr. et al. |
| 5,793,101 A | 8/1998 | Kuhn |
| 5,815,372 A | 9/1998 | Gallas |
| 5,883,426 A | 3/1999 | Tokuno et al. |

(Continued)

FOREIGN PATENT DOCUMENTS

KR    2003047403    6/2003

OTHER PUBLICATIONS

"3-D IC Packaging." Semiconductor International, May 1998, <http://www.semiconductor.net/semiconductor/archive/May98/docs/ind_news2.html>.

(Continued)

*Primary Examiner* — Walter H Swanson
*Assistant Examiner* — Wilner Jean Baptiste
(74) *Attorney, Agent, or Firm* — Perkins Coie LLP

(57) ABSTRACT

An assembly of microelectronic devices and method for forming an assembly of microelectronic devices. In one embodiment, an assembly comprises a support member having support member circuitry and a first microelectronic die attached to the support member and coupled to the support member circuitry with first conductive members. The assembly further comprises a second microelectronic die positioned at least proximate to the first microelectronic die and coupled directly to the support member circuitry with second conductive members that are not in direct contact with the first conductive members. One of the first or second microelectronic dies is positioned between the support member and the other of the first and second microelectronic dies.

19 Claims, 3 Drawing Sheets

(56) References Cited

U.S. PATENT DOCUMENTS

| | | | |
|---|---|---|---|
| 5,917,242 | A | 6/1999 | Ball |
| 5,946,553 | A | 8/1999 | Wood et al. |
| 5,986,209 | A | 11/1999 | Tandy |
| 5,990,566 | A | 11/1999 | Farnworth et al. |
| 6,013,948 | A | 1/2000 | Akram et al. |
| 6,020,624 | A | 2/2000 | Wood et al. |
| 6,020,629 | A | 2/2000 | Farnworth et al. |
| 6,028,365 | A | 2/2000 | Akram et al. |
| 6,040,046 | A | 3/2000 | Ghiam et al. |
| 6,051,878 | A | 4/2000 | Akram et al. |
| 6,072,233 | A | 6/2000 | Corisis et al. |
| 6,072,236 | A | 6/2000 | Akram et al. |
| 6,093,969 | A | 7/2000 | Lin |
| 6,100,594 | A | 8/2000 | Fukui et al. |
| 6,121,676 | A | 9/2000 | Solberg |
| 6,124,634 | A | 9/2000 | Akram et al. |
| 6,153,924 | A | 11/2000 | Kinsman |
| 6,154,366 | A | 11/2000 | Ma et al. |
| 6,157,080 | A | 12/2000 | Tamaki et al. |
| 6,160,718 | A | 12/2000 | Vakilian |
| 6,175,149 | B1 | 1/2001 | Akram |
| 6,212,767 | B1 | 4/2001 | Tandy |
| 6,221,682 | B1 | 4/2001 | Danziger et al. |
| 6,222,265 | B1 | 4/2001 | Akram et al. |
| 6,225,689 | B1 | 5/2001 | Moden et al. |
| 6,228,548 | B1 | 5/2001 | King et al. |
| 6,235,554 | B1 | 5/2001 | Akram et al. |
| 6,252,299 | B1 | 6/2001 | Masuda et al. |
| 6,258,623 | B1 | 7/2001 | Moden et al. |
| 6,261,865 | B1 | 7/2001 | Akram |
| 6,262,895 | B1 | 7/2001 | Forthun |
| 6,278,176 | B1 | 8/2001 | Nakamura et al. |
| 6,281,577 | B1 | 8/2001 | Oppermann et al. |
| 6,294,839 | B1 | 9/2001 | Mess et al. |
| 6,297,547 | B1 | 10/2001 | Akram |
| 6,303,981 | B1 | 10/2001 | Moden |
| 6,307,257 | B1 | 10/2001 | Huang et al. |
| 6,332,766 | B1 | 12/2001 | Thummel |
| 6,339,254 | B1 | 1/2002 | Venkateshwaran et al. |
| 6,340,846 | B1 | 1/2002 | LoBianco et al. |
| 6,365,963 | B1 | 4/2002 | Shimada |
| 6,404,046 | B1 | 6/2002 | Glenn et al. |
| 6,420,789 | B1 | 7/2002 | Tay et al. |
| 6,445,064 | B1 | 9/2002 | Ishii et al. |
| 6,465,892 | B1 | 10/2002 | Suga et al. |
| 6,472,735 | B2 | 10/2002 | Isaak |
| 6,472,758 | B1 | 10/2002 | Glenn et al. |
| 6,528,870 | B2 | 3/2003 | Fukatsu et al. |
| 6,552,910 | B1 | 4/2003 | Moon et al. |
| 6,560,117 | B2 | 5/2003 | Moon et al. |
| 6,607,937 | B1 | 8/2003 | Corisis |
| 6,670,701 | B2 | 12/2003 | Matsuura et al. |
| 6,674,159 | B1 | 1/2004 | Peterson et al. |
| 6,707,680 | B2 | 3/2004 | Schaper |
| 6,737,738 | B2 | 5/2004 | Koh et al. |
| 6,777,798 | B2 | 8/2004 | Fukumoto et al. |
| 6,784,023 | B2 | 8/2004 | Ball |
| 6,794,749 | B2 | 9/2004 | Akram |
| 6,828,665 | B2 | 12/2004 | Pu et al. |
| 6,836,009 | B2 | 12/2004 | Koon et al. |
| 6,838,761 | B2 | 1/2005 | Karnezos |
| 6,847,109 | B2 | 1/2005 | Shim |
| 6,857,470 | B2 | 2/2005 | Park et al. |
| 7,235,871 | B2 | 6/2007 | Corisis |
| 7,239,164 | B2 | 7/2007 | Tamaki |
| 7,247,934 | B2 | 7/2007 | Pu |
| 7,619,313 | B2 | 11/2009 | Corisis et al. |
| 7,723,839 | B2 | 5/2010 | Yano et al. |
| 7,723,852 | B1 | 5/2010 | Kim et al. |
| 8,067,827 | B2 | 11/2011 | Corisis |
| 2002/0004258 | A1 | 1/2002 | Nakayama et al. |
| 2002/0142515 | A1 | 10/2002 | Wehrly |
| 2003/0178719 | A1 | 9/2003 | Combs et al. |
| 2004/0016939 | A1 | 1/2004 | Akiba et al. |
| 2004/0038449 | A1 | 2/2004 | Corisis |
| 2004/0119152 | A1 | 6/2004 | Karnezos et al. |
| 2004/0180471 | A1 | 9/2004 | Matsuura et al. |
| 2004/0227250 | A1 | 11/2004 | Bolken et al. |
| 2005/0019984 | A1 | 1/2005 | Jiang et al. |
| 2005/0253224 | A1 | 11/2005 | Ho et al. |
| 2006/0102994 | A1 | 5/2006 | Pu |
| 2007/0045862 | A1 | 3/2007 | Corisis et al. |
| 2007/0176275 | A1 | 8/2007 | Singleton et al. |

OTHER PUBLICATIONS

Plöβl, A. and Kräuter, G., "Wafer direct bonding: tailoring adhesion between brittle materials," Materials Science and Engineering Reports: A Review Journal, vol. R25, Nos. 1-2, pp. 1-88, Mar. 10, 1999, ISSN 0927-796X.

STACKED MICROELECTRONIC DIES AND METHODS FOR STACKING MICROELECTRONIC DIES

CROSS-REFERENCE TO RELATED APPLICATIONS

This application is a continuation of U.S. application Ser. No. 11/751,402 filed May 21, 2000, now U.S. Pat. No. 8,067, 827, which is a divisional of U.S. patent application Ser. No. 10/620,714 filed Jul. 15, 2003, now U.S. Pat. No. 7,235,871, which is a divisional of U.S. application Ser. No. 09/644,766 filed Aug. 23, 2000, now U.S. Pat. No. 6,607,937, each of which is incorporated herein by reference in its entirety.

TECHNICAL FIELD

The present invention relates to stacked microelectronic dies and methods for stacking microelectronic dies.

BACKGROUND OF THE INVENTION

Packaged microelectronic assemblies, such as memory chips and microprocessor chips, typically include a microelectronic device mounted to a substrate and encased in a plastic protective covering. The device includes functional features, such a memory cells, processor circuits, and interconnecting circuitry. The device also typically includes bond pads electrically coupled to the functional features. The bond pads are coupled to pins or other types of terminals that extend outside the protective covering for connecting the microelectronic device to buses, circuits and/or other microelectronic assemblies.

One conventional approach to reducing the surface area occupied by packaged microelectronic devices in compact electronic products is to stack one packaged device on another packaged device having an identical configuration. For example, as shown in FIG. 1, an upper packaged microelectronic device 20b, can be stacked on a lower packaged microelectronic device 20a, (collectively referred to as packaged devices 20) and the assembly of packaged devices 20 can be attached to a printed circuit board (PCB) 30. Each packaged device 20 typically includes a die 24 encased in an encapsulant 23. Each die 24 has a plurality of die bond pads 25 connected to pins 43 that extend outside the encapsulant 23. Corresponding pins 43 of each packaged device 20 are connected directly to each other and to corresponding bond pads 31 on the PCB 30. The packaged devices 20 are also connected to each other by attaching an adhesive 11 between the encapsulant 23 of the lower packaged device 20a, and the encapsulant 23 of the upper packaged device 20b.

In another conventional arrangement shown in FIG. 2, two identical packaged devices 120 (shown as a lower packaged device 120a, and an upper packaged device 120b) are connected to each other and to a PCB 130 with solder balls 143. Each packaged device 120 can include a die 124 mounted to a substrate PCB 140 and encased with an encapsulant 123. Each die 124 has die bond pads 125 connected with wirebonds 126 to corresponding bond pads 131a, of the substrate PCB 140. The bond pads 131a, are connected to solder ball pads 131b, with circuitry internal to the support PCB 140. The solder balls 143 connect the solder ball pads 131b, of the upper package 120b, to the solder ball pads 131b, of the lower package 120a. Additional solder balls 143 connect the lower package 120a, to corresponding bond pads 131c, of the PCB 130.

One drawback with the conventional arrangements described above with reference to FIGS. 1 and 2 is that the stacked packaged devices are connected to each other. Accordingly, it can be difficult to remove and replace one packaged device without removing or damaging the other. Furthermore, this arrangement can require several tests to confirm that the packaged devices remain operable after each manufacturing step. For example, the packaged devices may be tested individually before they are coupled, then tested again after they are coupled to each other, and then tested yet again after the coupled packaged devices are mounted to the PCB. Each test can add to the time required to complete the final product, and can accordingly reduce the efficiency of the manufacturing process.

SUMMARY

The present invention is directed toward microelectronic package assemblies and methods for stacking packaged microelectronic devices. A method in accordance with one aspect of the invention includes positioning a first packaged microelectronic device adjacent to a support member having support member circuitry, and coupling the first packaged device to a first portion of the support member circuitry. The first packaged microelectronic device includes a first microelectronic die at least partially encased in a first encapsulant to define a first package configuration. The method further includes positioning at least proximate to the first packaged device a second packaged microelectronic device having a second microelectronic die at least partially encased in a second encapsulant to define a second package configuration different than the first package configuration. The second packaged device is electrically coupled to a second portion of the support member circuitry, and the first packaged device is positioned between the support member and the second packaged device. In a further aspect of this embodiment, the second packaged microelectronic device can be connected to the support member without being connected to the first packaged microelectronic device. Accordingly, the second packaged microelectronic device package can be removed from the support member without removing the first packaged microelectronic device.

The invention is also directed toward an assembly of packaged microelectronic devices. The assembly can include a support member having support member circuitry, and a first packaged microelectronic device connected to at least one of the support member and the support member circuitry. The first packaged device has a first microelectronic die at least partially encased in a first encapsulant to define a first package configuration. The assembly can further include a second packaged microelectronic device connected to at least one of the support member and the support member circuitry with the first packaged device positioned between the support member and the second packaged device. The second packaged device has a second microelectronic die at least partially encased in a second encapsulant to define a second package configuration different than the first package configurations, and the second packaged device can be connected directly to the support member without being connected to the first packaged device.

DETAILED DESCRIPTION

The present disclosure describes microelectronic devices and methods for stacking such devices. Many specific details of certain embodiments of the invention are set forth in the following description and in FIGS. 3-5 to provide a thorough understanding of these embodiments. One skilled in the art, however, will understand that the present invention may have additional embodiments, or that the invention can be practiced without several of the details described below.

Figure 3:
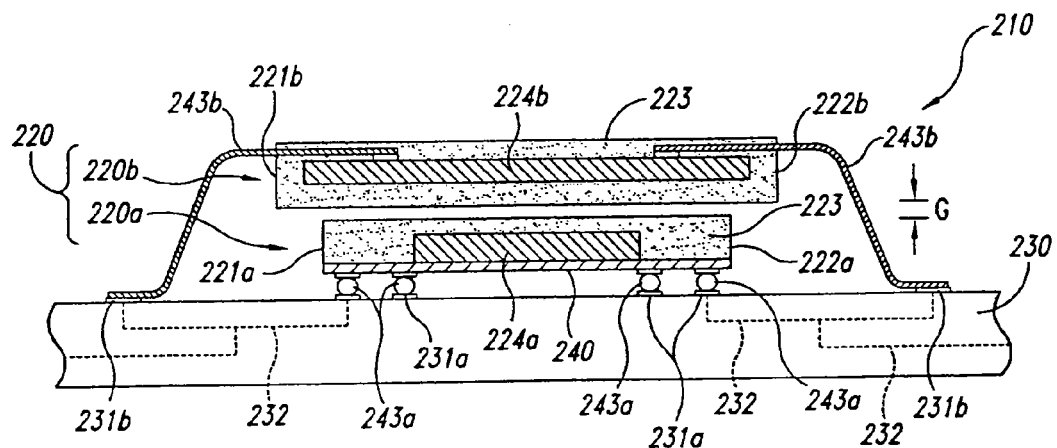
FIG. 3 is a partially schematic, cross-sectional side view of two packaged microelectronic devices stacked in accordance with an embodiment of the invention.

FIG. 3 is a partially schematic, cross-sectional side view of a microelectronic device assembly 210 that includes two packaged microelectronic devices 220 that are individually attached to a support member 230 in accordance with an embodiment of the invention. In one aspect of this embodiment, the assembly 210 can include a lower packaged device 220a, positioned between the support member 230 and an upper packaged device 220b. In a further aspect of this embodiment, the lower packaged device 220a, and the upper packaged device 220b, can have different configurations. For example, the lower packaged device 220a, can include a first microelectronic die 224a, mounted to a package substrate 240 (such as a PCB). The microelectronic features (such as integrated circuits) of the first microelectronic die 224a, can be electrically coupled to first connecting members 243a, (such as solder balls) with circuitry internal to the first microelectronic die 224a, and/or the substrate 240. The upper packaged device 220b, can include a second microelectronic die 224b, having internal microelectronic features electrically coupled to second connecting members 243b, (such as leads or pins). Both the lower packaged device 220a and the upper packaged device 220b, can include an encapsulating material 223 that at least partially encases the microelectronic dies 224a, and 224b.

In one embodiment, the support member 230 can include a PCB having first bond pads 231a, aligned with the first connecting members 243a, of the lower packaged device 220a,, and second bond pads 231b, aligned with the second connecting members 243b, of the second packaged device 220b. The bond pads 231a,, 231b, can be coupled to internal circuitry 232 of the support member 230. In one aspect of this embodiment, the internal circuitry 232 electrically couples the first bond pads 231a, to the second bond pads 231b, for coupling the lower packaged device 220a, to the upper packaged device 220b. Alternatively, the first bond pads 231a, can be electrically isolated from the second bond pads 231b. In either embodiment, the lower packaged device 220a, can be structurally and electrically connected to the support member 230 by attaching the first connecting members 243a, directly to the first bond pads 231a. The upper packaged device 220b, can be structurally and electrically connected to the support member 230 by attaching the second connecting members 243b, directly to the second bond pads 231b.

In one embodiment, the upper packaged device 220b, can be separated from the lower packaged device 220a, by a gap "G". Alternatively, the upper packaged device 220b, can rest on the lower packaged device 220a,, and in another alternative embodiment, the upper packaged device 220b, can be attached to the lower packaged device 220a. An advantage of spacing the upper packaged device 220b, apart from the lower packaged device 220a, is that heat can be more readily convected away from the lower surface of the upper packaged device 220b, and the upper surface of the lower packaged device 220a.

In any of the embodiments described above with reference to FIG. 3, the planform shape or "footprint" of the upper packaged device 220b, in a plane generally parallel to the support member 230 can be different than the planform shape of the lower packaged device 220a. For example, in one embodiment, the upper packaged device 220b, can have a first and second edges 221b,, 222b, that extend outwardly beyond corresponding first and second edges 221a,, 222a, of the lower packaged device 220a. Accordingly, the second connecting members 243b, can extend from the upper packaged device 220b, alongside the first and second edges 221a,, 222a, of the lower packaged device 220a, to the support member 230. In other embodiments, the assembly 210 can have other arrangements in which the upper packaged device 220b, has a different configuration than the lower packaged device 220a. For example, the upper packaged device 220b, can have a smaller planform shape than the lower packaged device 220a,, so long as the second connecting members 243b, can extend around the first and second edges 221a,, 222a, of the lower packaged device 220a, to contact the support member 230. In still further embodiments, the assembly 210 can include more than two packaged devices 220. For example, the assembly 210 can include three or more stacked packaged devices 220 with one or more of the packaged devices 220 connected to the support member 230 separately from the rest of the packaged devices 220

In one aspect of an embodiment of the assembly 210 described above with reference to FIG. 3, the first microelectronic die 224a, and the second microelectronic die 224b, can be identical, but the packaged device 220a, and 220b, can have different configurations so that the lower packaged device 220a, can fit beneath the upper packaged device 220b. Alternatively, the first microelectronic die 224a, in the lower packaged device 220a, can be different than the second microelectronic die 224b, in the upper packaged device 220b. For example, the first microelectronic die 224a, can have a different processor capability or a different memory capacity than the second microelectronic die 224b. Alternatively, the first and second microelectronic dies 224a,, 224b, can be functionally as well as configurationally distinct. For example, the first microelectronic die 224a can include a processor and the second microelectronic die 224b, can include memory circuits.

Figure 1:
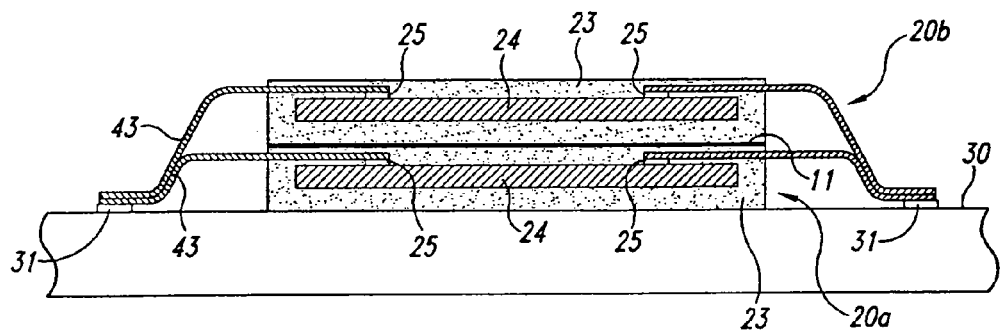
FIG. 1 is a partially schematic, cross-sectional side view of two packaged microelectronic devices stacked in accordance with the prior art.
Figure 2:
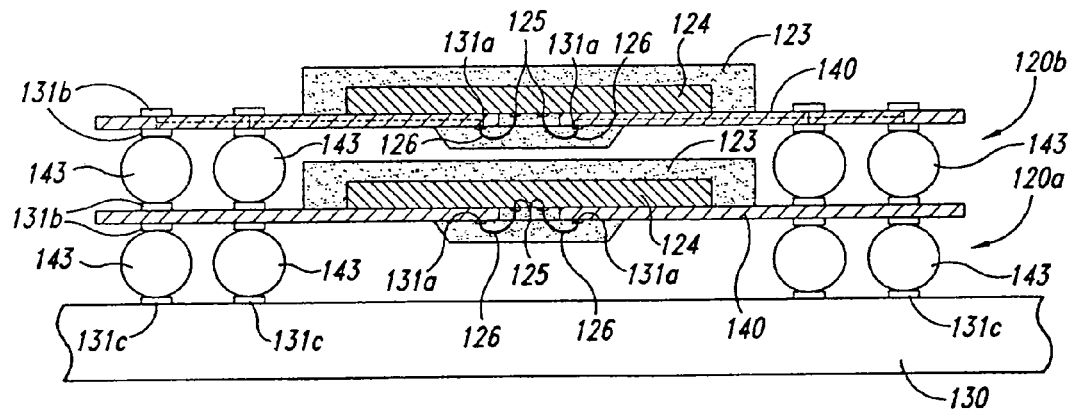
FIG. 2 is a partially schematic, cross-sectional side view of two packaged microelectronic devices stacked in accordance with another prior art arrangement.

One feature of an embodiment of the assembly 210 described above with reference to FIG. 3 is that the lower packaged device 220a, and the upper packaged device 220b, are each individually electrically coupled to the support member 230. An advantage of this feature is that the test requirements for the assembly 210 and the components of the assembly 210 can be less than the test requirements for some conventional arrangements. For example, both the lower packaged device 220a, and the upper packaged device 220b, can each be tested individually only once before mounting the packaged devices 220 to the support member 230 and once after mounting. In one specific example, the lower packaged device 220a, can be tested again after it is mounted to the support member 230, but before mounting the upper packaged device 220b, to the support member 230. Accordingly, if the lower packaged device 220a, fails the test, it can be serviced or replaced without disturbing the upper packaged device 220b. Alternatively, the upper packaged device 220b can be mounted to the support member 230 after mounting the lower packaged device 220a, but before testing the lower packaged device 220a. In either embodiment, the combination of the two packaged devices 220 need not be separately tested before mounting the packaged devices 220 to the support member because the packaged devices 220 are not directly electrically connected to each other before mounting, unlike some conventional arrangements such as those described above with reference to FIGS. 1 and 2.

Another feature of an embodiment of the assembly 210 described above with reference to FIG. 3 is that the upper packaged device 220b, can be structurally separate from the lower packaged device 220a. An advantage of this feature is that the upper packaged device 220b can be separately removed from the support member 230 and replaced (if necessary) without adversely affecting the lower packaged device 220a. Accordingly, the assembly 210 can be less expensive and less time-consuming to maintain and repair.

Still another feature of an embodiment of the assembly 210 described above with reference to FIG. 3 is that conventional techniques for attaching the packages to the support member 230 can be used. For example, conventional "pick and place" devices and methods that are typically used to position the lower packaged device 220a, and the upper packaged device 220b, on the support member 230 in a conventional unstacked arrangement can be used with little or no modification to stack the upper packaged device 220b, over the lower packaged device 220a, and attach both packaged devices 220 to the support member 230.

Figure 4:
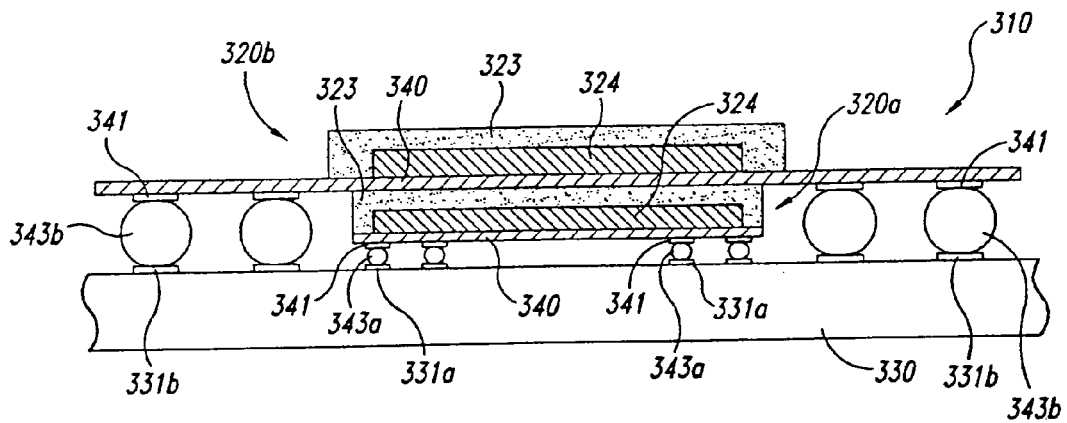
FIG. 4 is a partially schematic, cross-sectional side view of two stacked packaged microelectronic devices attached to a support member with solder balls in accordance with another embodiment of the invention.

FIG. 4 is a partially schematic, cross-sectional side view of a package assembly 310 having two packaged microelectronic devices 320 (shown as a lower packaged device 320a, and an upper packaged device 320b) individually connected to a support member 330 with solder balls in accordance with another embodiment of the invention. In one aspect of this embodiment, each packaged device 320a,, 320b, includes a microelectronic die 324 mounted to a package substrate 340 (such as a printed circuit board), encased in an encapsulant 323, and electrically coupled to bond pads 341 of the package substrate 340. First solder balls 343a, extend between the bond pads 341 of the lower packaged device 320 and corresponding first bond pads 331a, of the support member 330. Second solder balls 343b, extend between the bond pads 341 of the upper packaged device 320b, and corresponding second bond pads 331b, of the support member 330. The first bond pads 331a, can be electrically coupled to the second bond pads 331b, with circuitry internal to the support member 330, or alternatively, the first and second bond pads 331a,, 331b, can be electrically isolated, as described above with reference to FIG. 3. In either embodiment, each packaged device 320a, 320b, is individually connected (both structurally and electrically) to the support member 330.

In other embodiments, the assembly 310 can have other configurations. For example, the lower packaged device 320a, can be connected to the support member 330 with elongated conductive members (generally similar to the conductive members 243b, described above with reference to FIG. 3) instead of the first solder balls 343a. In still further embodiments, the lower packaged device 320a, and/or the upper packaged device 320b, can be connected to the support member 330 with other conductive members.

Figure 5:
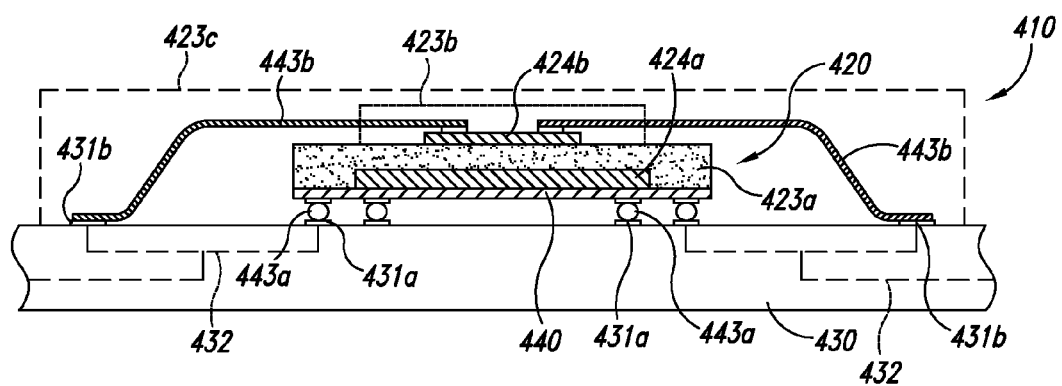
FIG. 5 is a partially schematic, cross-sectional side view of an initially unpackaged microelectronic die stacked on a packaged microelectronic die in accordance with yet another embodiment of the invention.

FIG. 5 is a partially schematic, cross-sectional side view of a package assembly 410 that includes an initially unpackaged microelectronic die in accordance with an embodiment of the invention. In one aspect of this embodiment, the assembly 410 can include a packaged microelectronic device 420 having a first microelectronic die 424a, mounted to a package substrate 440 and at least partially encased in a first encapsulating material 423a. The packaged device 420 is then coupled to first bond pads 431a, of an assembly support member 430 (such as a PCB) with first conductive members 443a, (such a solder balls). The assembly 410 can further include a second microelectronic die 424b, mounted directly to the first encapsulating material 423a. The second microelectronic die 424b, can be connected to corresponding second bond pads 431b, of the assembly support member 430 with second conductive members 443b, (such as pins). The first and second bond pads 431a, and 431b, can be coupled to internal circuitry 432 of the support member 430.

In one aspect of an embodiment of the assembly 410 described above with reference to FIG. 5, the second microelectronic die 424b, can be encapsulated after it has been mounted to the packaged microelectronic device 420. For example, a small volume of a second encapsulating material 423b, can be disposed around the upper microelectronic die 424b, and a portion of the second connecting members 443b. Alternatively, a larger volume of a second encapsulating material 423c, can be disposed over the entire assembly 410 to cover the packaged device 420, the upper microelectronic substrate 424b, and the second connecting members 443b.

In other embodiments, the assembly 410 can have other arrangements that include an initially unpackaged microelectronic die mounted directly to a packaged microelectronic die. For example, in one alternate embodiment, the second microelectronic die 424b, can be electrically coupled to the packaged device 420 in addition to or in lieu of directly coupling the second microelectronic die 424b, to the assembly support member 430. The second microelectronic die 424b, can contact the packaged device 420 (as shown in FIG. 5) or, alternatively, the second microelectronic die 424b, can be separated from the packaged device 420 by a gap in a manner generally similar to that described above with reference to FIG. 3. In still another alternative embodiment, the second microelectronic die 424b, can be attached (for example, with an adhesive) to the packaged device 420. In yet another embodiment, the second encapsulating material 423b, or 423c, that encases the second microelectronic die 424b, can be eliminated. In still a further embodiment, the relative positions of the second microelectronic die 424b, and the packaged device 420 can be reversed so that the second microelectronic die 424b, is positioned between the assembly support member 430 and the packaged device 420.

From the foregoing it will be appreciated that specific embodiments of the invention have been described herein for purposes of illustration, but that various modifications may be made without deviating from the spirit and scope of the invention. Accordingly, the invention is not limited except as by the appended claims.

The invention claimed is:

1. An assembly of microelectronic devices, comprising:
   a support member having support member circuitry;
   a first microelectronic die package attached to the support member and including a first die and a first substrate coupling the first die to the support member circuitry with first conductive members, wherein the first substrate has a first planform shape; and a second microelectronic die package attached to the first die package and including a second die and a second substrate, the second substrate coupling the second die to the support member circuitry with second conductive members, wherein the second substrate has a second planform shape that extends at least partially beyond the first planform shape, and wherein the second conductive members are positioned within the second planform shape.

2. The assembly of claim 1, wherein the first microelectronic die package includes an encapsulant at least partially encapsulating the first die, and wherein the second substrate of the second microelectronic die package engages the encapsulant.

3. The assembly of claim 1, wherein the first microelectronic die package includes an encapsulant at least partially encapsulating the first die, and wherein the encapsulant has a third planform shape that is generally similar to the first planform shape of the first substrate of the first microelectronic die package.

4. The assembly of claim 1, wherein the second microelectronic die package includes an encapsulant at least partially encapsulating the second die and having a third planform shape that is different than the second planform shape of the second substrate of the second microelectronic die package.

5. The assembly of claim 1, wherein the second microelectronic die package includes an encapsulant at least partially encapsulating the second die and having a third planform shape that is different than both the first planform shape of the first substrate of the first microelectronic die package and the second planform shape of the second substrate of the second microelectronic die package.

6. The assembly of claim 1, wherein the first conductive members are positioned within the first planform shape of the first substrate of the first microelectronic die package.

7. The assembly of claim 1, wherein:
the first planform shape has a perimeter;
the first conductive members are positioned outside of the perimeter; and
the second conductive members are positioned within the perimeter.

8. An assembly of microelectronic devices, comprising:
a support member having support member circuitry;
a first microelectronic die package attached to the support member and including a first die at least partially encased in a first encapsulant and coupled to the support member circuitry with first conductive members, the first microelectronic die package having a first edge and a second edge facing opposite the first edge;
a second microelectronic die package including a second die at least partially encased in a second encapsulant and coupled to the support member circuitry with second conductive members, the second microelectronic die package including a substrate between the first encapsulant of the first microelectronic die package and the second encapsulant of the second microelectronic die package, wherein the substrate has a third edge and a fourth edge facing opposite the third edge, and wherein the third edge of the second microelectronic die package extends outwardly beyond the first edge of the first microelectronic die package and the fourth edge of the second microelectronic die package extends outwardly beyond the second edge of the first microelectronic die package.

9. The assembly of claim 8, wherein the first and second edges of the first microelectronic die package correspond to edges of the first encapsulant of the first microelectronic die package.

10. The assembly of claim 8, wherein the first microelectronic die package comprises another substrate, and wherein the first and second edges of the first microelectronic die package correspond to edges of the other substrate of the first microelectronic die package.

11. The assembly of claim 8, wherein the second conductive members package are adjacent to the first and second edges of the first microelectronic die package.

12. The assembly of claim 8, wherein the first conductive members are positioned inwardly from the first and second edges of the first microelectronic die package, and wherein the second conductive members are positioned outwardly from the first and second edges of the first microelectronic die package.

13. The assembly of claim 8, wherein the support member includes a fifth surface and the substrate of the second microelectronic die package includes a sixth surface that faces the fifth surface of the support member, and wherein the second conductive members extend between the fifth and sixth surfaces.

14. The assembly of claim 8, wherein the first conductive members of the first microelectronic die package include first solder balls and the second conductive members include second solder balls that are larger than the first solder balls.

15. An assembly of microelectronic devices, comprising:
support member having support member circuitry;
a first substrate attached to the support member and coupled to the support member circuitry with first conductive members, the first substrate carrying a first microelectric die and the first substrate having a first footprint;
a second substrate attached to the first substrate and coupled to the support member circuitry with second conductive members, the second substrate carrying a second microelectronic die and the second substrate having a second footprint that is different than the first footprint of the first substrate;and
an encapsulant at least partially encapsulating the second die and attached to a portion of the second substrate, wherein the encapsulant has a third footprint that is larger than the first footprint of the first substrate.

16. The assembly of claim 15, wherein the encapsulant is a first encapsulant, and wherein the assembly further comprises a second encapsulant at least partially encapsulating the first die and attached to a portion of the first substrate, wherein the second substrate is engaged with the second encapsulant.

17. The assembly of claim 15, wherein the first conductive members are positioned within the first footprint of the first substrate.

18. The assembly of claim 15, wherein the first conductive members include first solder balls and the second conductive members include second solder balls that are larger than the first solder balls.

19. An assembly of microelectronic devices, comprising:
a support member having support member circuitry;
a first substrate attached to the support member and coupled to the support member circuitry with first conductive members, the first substrate carrying a first microelectronic die and the first substrate having a first footprint;and
a second substrate attached to the first substrate and coupled to the support member circuitry with second conductive members, the second substrate carrying a second microelectronic die and the second substrate having a second footprint that is different than the first footprint of the first substrate,
wherein the first substrate includes a first surface, the second substrate includes a second surface, and the support member includes a third surface that faces the first and second surfaces, and wherein the first conductive members extend between the first and third surfaces and the second conductive members extend between the second and third surfaces.

* * * * *

UNITED STATES PATENT AND TRADEMARK OFFICE
CERTIFICATE OF CORRECTION

PATENT NO. : 8,587,109 B2
APPLICATION NO. : 13/305564
DATED : November 19, 2013
INVENTOR(S) : David J. Corisis Page 1 of 1

It is certified that error appears in the above-identified patent and that said Letters Patent is hereby corrected as shown below:

In the Claims:

In column 8, line 30, before "support" insert -- a --.

In column 8, line 34, delete "microelectric" and insert -- microelectronic --, therefor.

In column 8, line 41, delete "substrate;and" and insert -- substrate; and --, therefor.

In column 8, line 64, delete "footprint;and" and insert -- footprint; and --, therefor.

Signed and Sealed this
Eighteenth Day of February, 2014

Michelle K. Lee
*Deputy Director of the United States Patent and Trademark Office*